United States Patent [19]
Baker et al.

[11] Patent Number: 5,754,455
[45] Date of Patent: May 19, 1998

[54] METHOD AND APPARATUS FOR SETTING A BIT-SERIAL FILTER TO AN ALL-ZERO STATE

[75] Inventors: James Clark Baker, Hanover Park; Denise Carol Riemer, Gurnee, both of Ill.

[73] Assignee: Motorola, Inc., Schaumburg, Ill.

[21] Appl. No.: 631,321

[22] Filed: Apr. 10, 1996

[51] Int. Cl.$^6$ .................................................. G06F 17/10
[52] U.S. Cl. ........................... 364/724.17; 364/724.16
[58] Field of Search ........................... 364/724.17, 724.16

[56] References Cited

U.S. PATENT DOCUMENTS

| | | | |
|---|---|---|---|
| 3,714,402 | 1/1973 | Baumwolspiner | 364/724.17 |
| 4,285,047 | 8/1981 | Ohnishi | 364/785 |
| 5,034,909 | 7/1991 | Hartley | 364/724.17 |
| 5,204,831 | 4/1993 | Gazsi et al. | 364/785 |
| 5,335,194 | 8/1994 | Clayton et al. | 364/724.16 |

*Primary Examiner*—David H. Malzahn
*Attorney, Agent, or Firm*—Sylvia Chen; Rolland R. Hackbart

[57] ABSTRACT

Bit-serial digital filters use numerous flip-flops, which must be reset to a known, all-zero state for testing and start-up purposes. A method for setting a bit-serial digital filter to an all-zero state uses non-resettable flip-flops, which eliminates the increased gate count and current drain overhead of resettable flip-flops. A bit-serial digital filter is constructed using non-resettable flip-flops such as simple non-resettable D flip-flops. When a reset signal is initiated, a reset controller (350) sends an all-zero signal to reset gates (301, 321) positioned at the input to the digital filter and in each feedback loop or unit-delay path. Meanwhile, a bit-serial controller (250) cycles through its control signals to emulate the operation of the bit-serial filter. In two word cycles, each flip-flop in the digital filter will be set to a known, all-zero state, and the all-zero signal is removed to allow normal operation of the filter.

20 Claims, 3 Drawing Sheets

METHOD AND APPARATUS FOR SETTING A BIT-SERIAL FILTER TO AN ALL-ZERO STATE

CROSS-REFERENCE TO RELATED APPLICATIONS

This application is related to application Ser. No. 08/656,131 by James C. Baker filed Apr. 10, 1996, the specification of which is incorporated herein. This application is also related to application Ser. No. 08/659,104 by James C. Baker and John Oliver filed Apr. 10, 1996, the specification of which is incorporated herein.

FIELD OF THE INVENTION

This invention relates generally to integrated circuit testing, and more particularly to a method for setting flip-flops in a bit-serial digital filter to an all-zero state.

BACKGROUND OF THE INVENTION

Any digital filter can be built using bit-serial architecture, which reduces the gate count, silicon area, and current drain of the integrated circuit compared to an equivalent parallel filter design. Bit-serial filters use three basic building blocks: bit-serial adders, bit-serial scalers, and bit-serial delays. A bit-serial adder has only one full adder with two one-bit inputs and a single one-bit output. To achieve a dynamic range equivalent to that of a thirty-two bit parallel adder, the clock rate of the bit-serial adder is increased by a factor of thirty-two compared to the parallel adder. Generally speaking, $f_{bit}=B*f_{sample}$, where $f_{bit}$ is the bit-serial adder clock rate, B is the number of bits in a word, and $f_{sample}$ is the digital word sampling rate. Each bit in a word, from the least significant bit (LSB) to the most significant bit (MSB), appears on a serial bus for one bit time period, $1/f_{bit}$. Bit-serial scaling is achieved by shifting bits in a word to the right by N bits using a bit-repeater block, which results in a multiplication by $2^{-N}$. Summing bit-shifted versions of the input word results in a word multiplied by a selected coefficient. Bit-serial delays are implemented using a shift register that holds a bit for a predetermined number of bit time periods using flip-flops.

Bit-serial designs also require a controller. The bit-serial controller can be viewed as a shift register with a "one" signal of one bit time period circulating sequentially through the shift register. The length of the shift register is equal to the number of bits in a word, B. Signals from the bit-serial controller must be routed to adder blocks to coincide with the clock cycle that the first bit of a word, the LSB, appears at the input to a particular adder block. Signals from the bit-serial controller are also routed to bit-repeater blocks to specify a scaling coefficient for each particular bit-repeater block.

Bit-serial architecture enables digital filters and other digital signal processing elements to have reduced gate count, silicon area, and current drain compared to parallel architecture digital filters. The trade-off, however, for this reduced gate count is a higher clock speed. Bit-serial designs extensively use flip-flops for synchronization. These flip-flops must be set to a known, all-zero state for testing and other functional purposes, and the simplest way to set the flip-flops to a known, all-zero state is to use resettable flip-flops. Replacing each resettable flip-flop in a bit-serial digital filter with a non-resettable flip-flop, however, would significantly decrease the silicon area of the filter. Using non-resettable flip-flops, such as simple non-resettable D flip-flops, could reduce the gate count of a bit-serial digital filter by twenty-five percent. Thus, a need exists for a method of setting flip-flops in a bit-serial design to a known, all-zero state without the use of resettable flip-flops.

DETAILED DESCRIPTION OF THE INVENTION

A method for setting a bit-serial digital filter to an all-zero state eliminates the need for resettable flip-flips in bit-serial designs, which reduces the complexity of the filter. The method uses a reset controller and reset gates at the filter input and in each filter feedback loop. When a reset signal is activated, the reset controller cooperates with a bit-serial controller to provide an all-zero signal at the output of the reset gates while the filter runs through several word cycles. This causes an all-zero signal stream to propagate through the bit-serial filter, and within two word cycles all the flip-flops in the filter are set to a known, all-zero state without the overhead of resettable flip-flops. Using the reset circuitry and simple non-resettable D flip-flops in a bit-serial filter results in reduced gate count, silicon area, and current drain compared to using resettable flip-flops.

Bit-serial architecture can be used to implement any digital filter. Both finite-duration impulse response (FIR) filters and infinite-duration impulse response (IIR) filters can benefit from a reduction in gate count through the use of bit-serial architecture. A further gate count reduction can then be realized by having non-resettable flip-flops in the filter and using the disclosed method to set the filter to a known, all-zero state whenever a reset is needed, such as during a start-up, manual reset, or test. As an example, a first-order lowpass wave digital filter can be implemented using bit-serial architecture and include reset circuitry for setting non-resettable flip-flops in the filter to a known, all-zero state. Also in this example, a digital word is thirty-two bits in length. Of course, other digital filters may be implemented and other word lengths may be used with this method.

Figure 1:
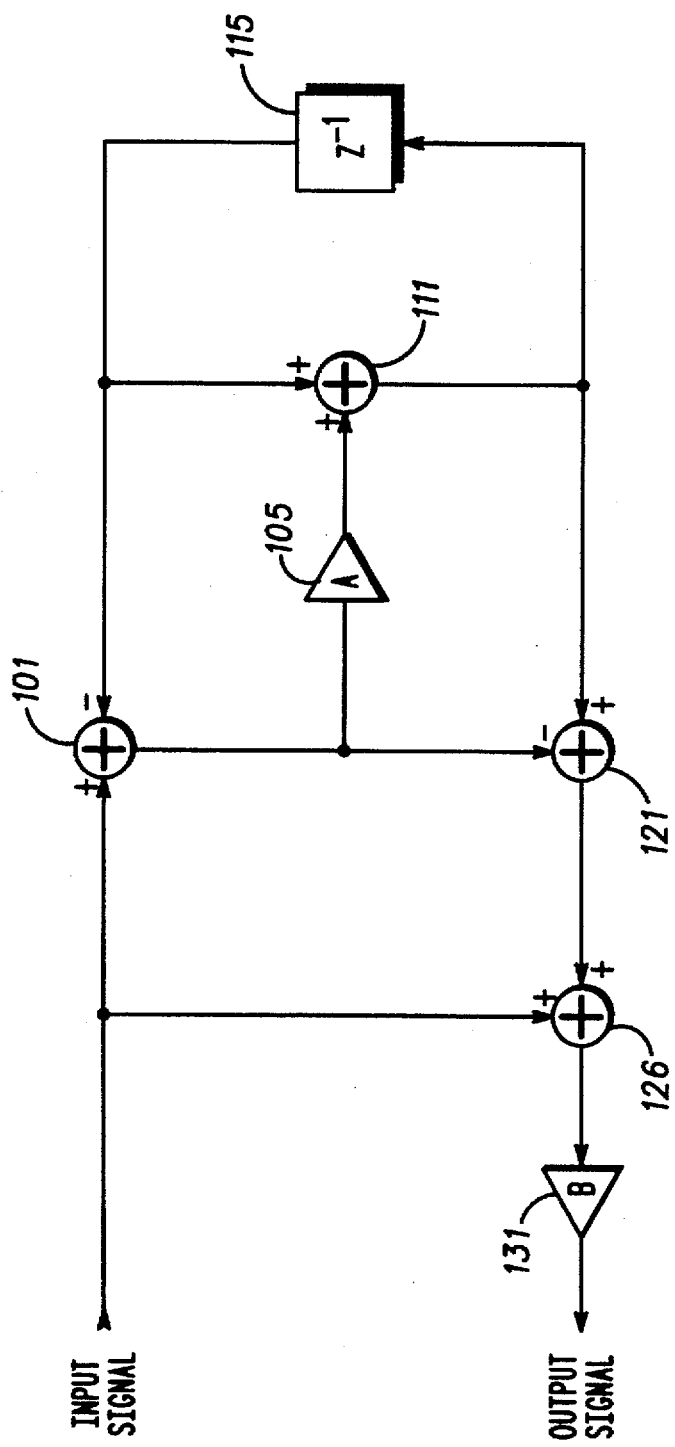
FIG. 1 shows a signal flow diagram of a first-order lowpass wave digital filter.

FIG. 1 shows a signal flow diagram of a first-order lowpass wave digital filter. This filter is an IIR filter with a single feedback loop through unit-delay block 115. An input signal enters adder 101. The output of adder 101 is sent to scaler 105 and multiplied by coefficient A. Coefficient A, which determines the filter cut-off frequency, is usually set to a number less than one. In this example, coefficient A is set to $2^{-4}$. The output of scaler 105 is sent to adder 111. The output of adder 111 is delayed using unit-delay block 115. The output of unit-delay block 115 is negatively fed back to adder 101 and positively fed back to adder 111. The unit-delay block 115 represents a delay of one word cycle, which is thirty-two bit cycles in this example. The output of adder 111 is also sent to adder 121 which subtracts the output of adder 101. The output of adder 121 is summed with the input signal using adder 126. The output of adder 126 is multiplied by coefficient B using scaler 131 to produce an output signal. Generally, coefficient B is one-half to produce a unity gain wave digital filter. This signal flow diagram can be implemented in a digital filter composed of bit-serial building blocks and a bit-serial controller as shown in FIG. 2.

Figure 2:
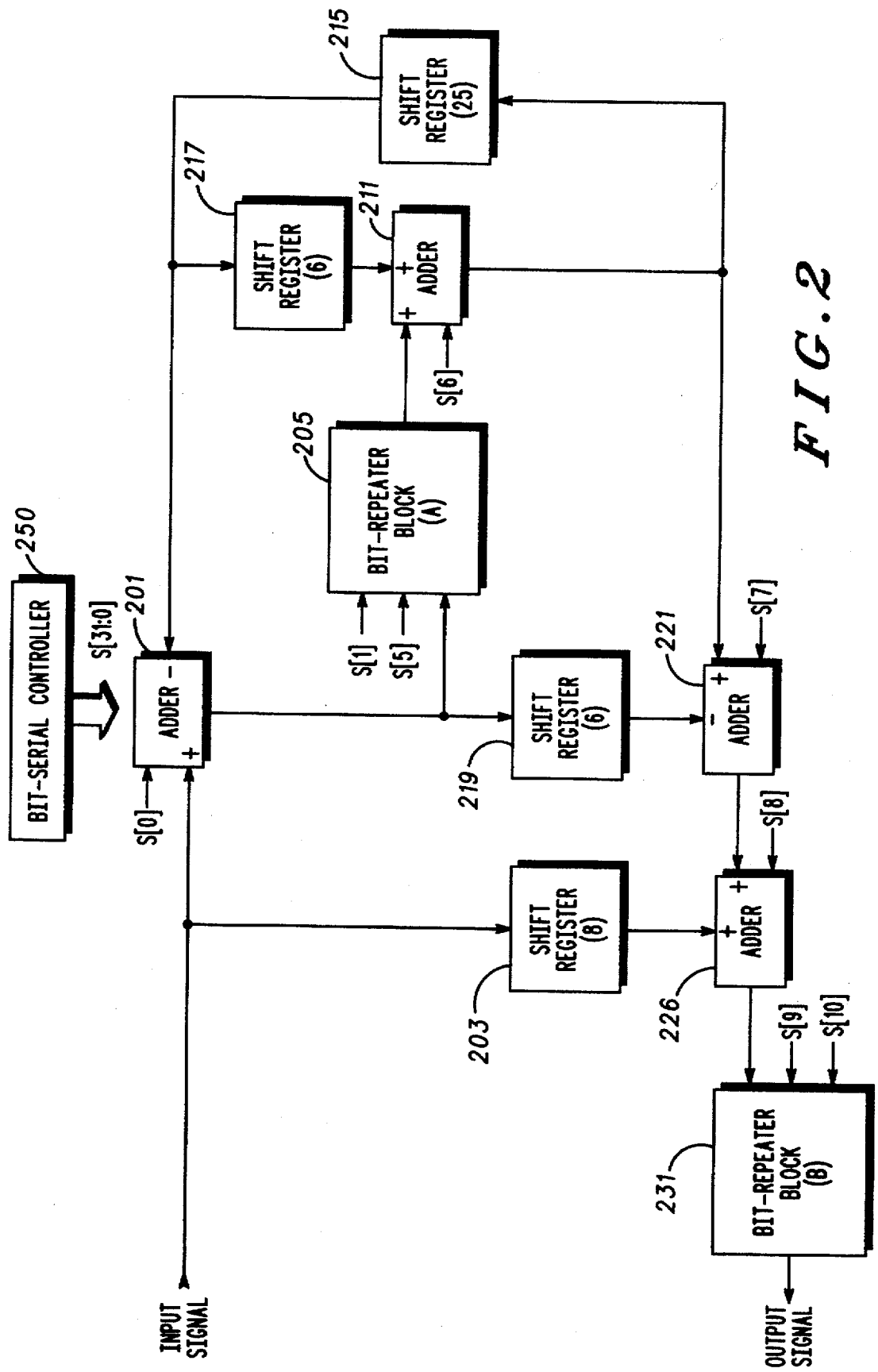
FIG. 2 shows a bit-serial implementation of a first-order lowpass wave digital filter.

FIG. 2 shows a bit-serial implementation of a first-order lowpass wave digital filter. A combination of the three bit-serial building blocks is used to build a thirty-two bit IIR wave digital filter. Note that all sequential elements in this drawing, including the bit-serial controller, are clocked at the serial bit rate, $f_{bit}$. An input signal enters adder 201. The bit-serial controller 250 sends a signal s[0] as the LSB of each word enters the adder. Scaling the output of adder 201 by coefficient A, which in this example is $2^{-4}$, bit-repeater block 205 shifts each bit in a word four bits to the right. The bit-serial controller 250 sends a signal s[1] to the bit-repeater block 205 when the LSB of a word enters the block and another signal s[5], which is four bit time periods later. The output of bit-repeater block 205 then enters adder 211. Again, the bit-serial controller 250 indicates with signal s[6] when the LSB of a word enters an adder.

The output of adder 211 is delayed twenty-five times the bit time period ($25/f_{bit}$) using shift register 215. Because adder 201, bit-repeater block 205, and adder 211 have already delayed a word by seven bit time periods, only twenty-five additional bit time period delays are required to produce a unit delay of thirty-two bit time periods at the output of shift register 215. The output of shift register 215 is negatively fed back to adder 201. The output of shift register 215 is also sent to shift register 217, delayed six times the bit time period ($6/f_{bit}$) so that the LSB of a word from shift register 217 coincides with the LSB of a word from bit-repeater block 205, and sent back to adder 211. The output of adder 211 is also sent to adder 221. The output of adder 201 is delayed six times the bit time period ($6/f_{bit}$) using shift register 219 and negatively entered into adder 221. The bit-serial controller 250 sends a signal s[7] when the LSBs of the two input words enter adder 221.

The output of adder 221 is summed with the input signal, which has been delayed eight times the bit time period ($8/f_{bit}$) by shift register 203 so that the LSBs of both addends arrive simultaneously at adder 226. Bit-serial controller uses signal s[8] to indicate when the LSBs of the addends enter the adder 226. The output of adder 226 is scaled by coefficient B, which is $2^{-1}$, using bit-repeater block 231 to shift each bit in an incoming word by one bit to the right. Bit-serial controller 250 sends a signal s[9] when the LSB of a word arrives and another signal s[10] one bit time period later to indicate that the word should be scaled by $2^{-1}$. An output signal emerges from bit-repeater block 231.

Due to the synchronous nature of the bit-serial process, each of the bit-serial building blocks contains flip-flops. For testing purposes and to guarantee proper operation, these sequential building blocks must be set to a known, all-zero state on command. Resettable flip-flops can set the filter to an all-zero state, however, they have an increased gate count, silicon area, and current drain compared to non-resettable flip-flops. Replacing resettable flip-flops with non-resettable flip-flops in the filter shown in FIG. 2 would decrease the gate count by twenty-five percent. Clearly, for larger designs, the replacement of resettable flip-flops would result in a substantial decrease in current drain and silicon area. Thus, FIG. 3 demonstrates a manner of resetting a bit-serial filter without the overhead of resettable flip flips.

Figure 3:
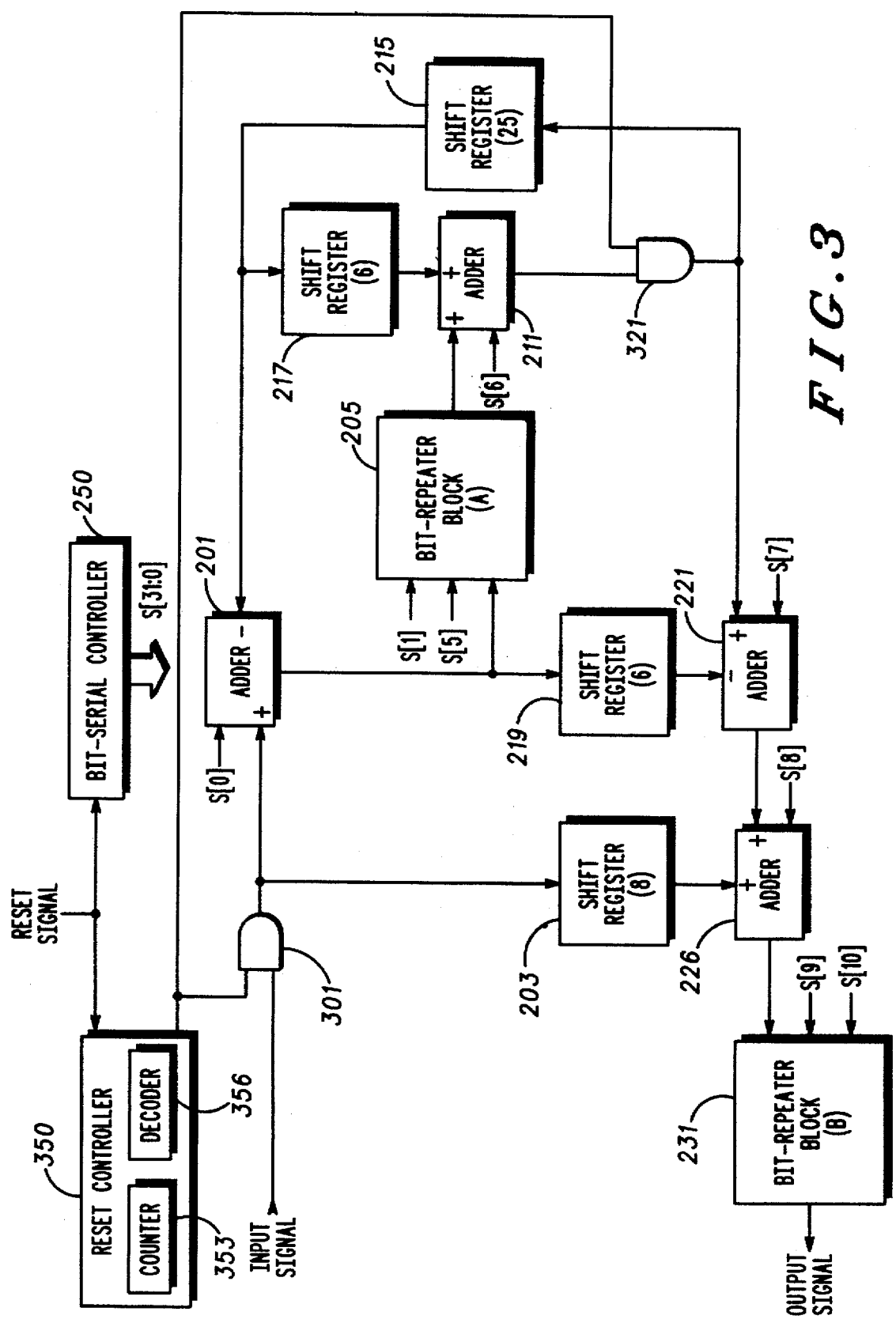
FIG. 3 shows a bit-serial implementation of a first-order lowpass wave digital filter having reset circuitry according to a preferred embodiment.

FIG. 3 shows a bit-serial implementation of a first-order lowpass wave digital filter having reset circuitry according to a preferred embodiment. The flip-flops in this bit-serial filter are simple non-resettable D flip-flops. The reset circuitry merely adds reset controller 350 and reset gates 301, 321 to the wave digital filter shown in FIG. 2. All sequential elements are clocked at the serial bit rate, except the reset controller. The filter is reset by applying an all-zero signal at the filter input using AND logic gate 301 and breaking the IIR feedback path by applying an all-zero signal to the feedback loop using AND logic gate 321. Alternatively, any mechanism that feeds an all-zero signal to the filter input and each feedback loop or unit-delay path can be used. For example, switches, multiplexers, or other logic gates such as NAND gates may be used to set the filter to an all-zero state. Two complete word cycles (e.g., sixty-four bit time periods) after a reset signal is initiated, all flip-flops in the filter will be set to zero.

A reset signal, preferably a pulse, is initiated by a start-up, manual reset, or test indication. When the reset controller 350 receives the reset signal, the counter 353 in the reset controller 350 and the bit-serial controller 250 are initialized. Preferably counter 353 is a two-bit counter, however, other devices such as state machines may be used to control the reset cycle. The bit-serial controller 250 begins cycling through the standard control signals by shifting a "one" signal from its LSB to its MSB at the bit rate, which emulates normal filter operation. Meanwhile, the two-bit counter 353, which runs at the word rate, is initialized to a count of zero, and the reset controller 350 starts producing an all-zero signal that is sent to each AND logic gate 301, 321 in the reset circuitry. Thus, an all-zero signal is sent to the filter input and each feedback loop or unit delay path. The two-bit counter 353 increments after each word cycle. After two complete word cycles, the flip-flops in the filter will be set to an all-zero state. Preferably, the decoder 356 indicates when the counter reaches a count of two. The reset controller 350 will then establish an all-one signal at each reset gate 301, 321 and the digital filter can start operating from a known, all-zero starting point for all circuit paths.

In certain situations, reset logic gates may not be needed at a filter input or in each feedback loop. Additional word cycles, however, may be needed to set all the flip-flops in the filter to an all-zero state in those cases. Thus, the decoder 356 may wait until the two-bit counter 353 reaches a final count of three before indicating that the reset cycle is complete. Of course, other counters of different lengths can be used to alter the length of the reset cycle. Alternatively, additional reset gates may be included in the filter to reduce the reset cycle to less than two word cycles.

While resettable flip-flops in a bit-serial digital filter would allow the filter to be reset in one clock cycle, it would be at the expense of an increased gate count. The actual size of the reset circuitry, including the reset controller 350 and the two AND logic gates 301, 321 shown, is twenty-seven gates. The equivalent gate size of the reset circuitry can be calculated as one reset controller plus N+1 AND gates, where N is equal to the filter order. Thus, even complex filters can be set to an all-zero state with the use of only a few gates. The reset controller can control not only the setting of a single filter to an all-zero state, but it can control the setting of an entire bit-serial design, such as an Advanced Mobile Phone System (AMPS) digital audio processor, to an all-zero state. The reset method illustrated in FIG. 3 provides full reset functionality in two word cycles with a minimal gate count increase. This short reset period is important both for test time as well as start-up time during normal operation.

Thus, resettable flip-flops can be eliminated from a bit-serial filter. While specific components and functions of the method for setting a bit-serial filter to an all-zero state are described above, fewer or additional functions could be employed by one skilled in the art within the true spirit and scope of the present invention. The invention should be limited only by the appended claims.

We claim:

1. A method for setting a bit-serial filter to an all-zero state comprising the steps of:

inserting a first reset gate at an input of the bit-serial filter;

generating a first signal from a reset controller; and connecting the first signal to an input of the first reset gate to produce an all-zero signal to the input of the bit-serial filter.

2. A method for setting a bit-serial filter to an all-zero state according to claim 1 wherein the first reset gate is an AND logic gate.

3. A method for setting a bit-serial filter to an all-zero state according to claim 2 wherein the first signal from the reset controller is an all-zero signal.

4. A method for setting a bit-serial filter to an all-zero state according to claim 1 wherein the first signal from the reset controller produces an all-zero signal at an output of the first reset gate.

5. A method for setting a bit-serial filter to an all-zero state according to claim 1 further comprising the steps of:

disconnecting the first signal from the input of the first reset gate.

6. A method for setting a bit-serial filter to an all-zero state according to claim 5 wherein the step of disconnecting comprises the step of:

connecting a second signal from the reset controller to the input of the first reset gate.

7. A method for setting a bit-serial filter to an all-zero state according to claim 6 wherein the second signal from the reset controller produces an all-one signal at an input of the first reset gate.

8. A method for setting a bit-serial filter to an all-zero state according to claim 6 wherein the first reset gate is an AND logic gate.

9. A method for setting a bit-serial filter to an all-zero state according to claim 8 wherein the second signal from the reset controller is an all-one signal.

10. A method for setting a bit-serial filter to an all-zero state according to claim 5 wherein the step of disconnecting occurs two word time periods after the step of connecting.

11. A method for setting a bit-serial filter to an all-zero state according to claim 1 wherein the reset controller comprises a counter.

12. A method for setting a bit-serial filter to an all-zero state according to claim 11 wherein the counter is a two-bit counter.

13. A method for setting a bit-serial filter to an all-zero state according to claim 1 wherein the reset controller comprises a decoder.

14. A method for setting a bit-serial filter to an all-zero state according to claim 1 further comprising the steps of:

inserting a second reset gate in a feedback loop of the bit-serial filter; and connecting the first signal to an input of the second reset gate to produce an all-zero signal in the feedback loop.

15. A method for setting a bit-serial filter to an all-zero state according to claim 1 further comprising the steps of:

inserting a second reset gate at an input to a unit-delay path of the bit-serial filter; and connecting the first signal to an input of the second reset gate to produce an all-zero signal to the input of the unit delay path.

16. A bit-serial filter comprising:

a bit-serial input to a bit-serial block containing a non-resettable flip-flop;

a bit-serial controller connected to the bit-serial block;

a reset gate connected to the bit-serial input; and a reset controller connected to the reset gate for setting the non-resettable flip-flop to a zero state.

17. A bit-serial filter according to claim 16 wherein the bit-serial block comprises:

a bit-serial adder.

18. A bit-serial filter according to claim 16 wherein the bit-serial block comprises:

a bit-serial scaler.

19. A bit-serial filter according to claim 16 wherein the bit-serial block comprises:

a bit-serial shift register.

20. A bit-serial filter according to claim 16 wherein the reset gate comprises:

an AND logic gate.

* * * * *